United States Patent [19]
Aldridge et al.

[11] Patent Number: 5,737,693
[45] Date of Patent: Apr. 7, 1998

[54] METHOD AND SYSTEM FOR GENERATING ARBITRARY ANALOG WAVEFORMS

[75] Inventors: Christopher Aldridge, Reading, United Kingdom; Pranesh Sinha, Pine Grove, Singapore

[73] Assignee: Institute of Microelectronics, Science Park II, Singapore

[21] Appl. No.: 582,741

[22] Filed: Jan. 4, 1996

[30] Foreign Application Priority Data

Oct. 28, 1995 [SG] Singapore .................... 9501667-1

[51] Int. Cl.$^6$ ........................................... H04B 17/00
[52] U.S. Cl. .................... 455/67.4; 455/115; 455/226.1
[58] Field of Search .......................... 455/67.1, 67.4, 455/93, 115, 9, 226.1–226.4, 67.3; 375/224, 221; 341/147; 324/527

[56] References Cited

U.S. PATENT DOCUMENTS

| | | | |
|---|---|---|---|
| 4,539,709 | 9/1985 | Conner | 455/67.3 |
| 5,237,324 | 8/1993 | Linz et al. | 341/147 |
| 5,481,186 | 1/1996 | Heutmaker et al. | 455/67.4 |
| 5,487,089 | 1/1996 | Misaizu et al. | 375/296 |
| 5,539,772 | 7/1996 | Fasulo, II et al. | 375/224 |

*Primary Examiner*—Reinhard J. Eisenzopf
*Assistant Examiner*—Nguyen Vo
*Attorney, Agent, or Firm*—Meltzer, Lippe, Goldstein, et al.

[57] ABSTRACT

A baseband simulation system is disclosed for testing an RF subsystem of a communication device, such as a cellular telephone, cordless telephone, etc. A preferred embodiment has a computer connected to an interface card which in turn is connected to a baseband simulation subsystem. The baseband simulation subsystem is connected to the RF subsystem under test. The baseband simulation subsystem includes three ports: a timing and control (TAC) port, an IQ port, and general purpose input output (GPIO) port. The TAC port receives a master clock signal from an external source and generates plural clocks therefrom. The IQ and GPIO ports receives at least one of these plural clocks. In a transmit mode, in response to one or more of the clocks generated by the TAC port, the IQ port retrieves from its memory prestored discrete I and Q samples and reconstructs therefrom arbitrary transmit analog i and q signals which are provided to the RF subsystem under test. In a receive mode, the IQ port receives analog i and q signals from the RF subsystem. The IQ port, in response to one or more clocks generated by the TAC port, converts the received analog i and q signals receive discrete I and Q samples. These receive discrete I and Q samples are transferred via the PCIF to the PC for analyzing the ability of the RF subsystem under test to modulate the inputted transmit analog i and q signals on one or more RF carrier signals and to demodulate the RF carrier signals to output the receive analog i and q signals. The GPIO port exchanges auxiliary discrete data with the PC and auxiliary analog signals with the RF subsystem under test.

13 Claims, 6 Drawing Sheets

METHOD AND SYSTEM FOR GENERATING ARBITRARY ANALOG WAVEFORMS

RELATED APPLICATIONS

The following patent applications are assigned to the assignee hereof and contain subject matter related to the subject matter of the present patent application:

1. U.S. patent application Ser. No. 08/582,743, entitled "A Baseband Simulator Architecture For Testing A Radio Frequency Section Of A Mobile Communications Transceiver", filed on even date herewith for Christopher ALDRIDGE and Pranesh SINHA, and 2. U.S. patent application Ser. No. 08/582,742, entitled "Multiple Clock Generation In A Baseband Simulator For Testing A Radio Frequency Section Of A Mobile Communications Transceiver", filed on even date herewith for Christopher ALDRIDGE and Pranesh SINHA. The contents of the above-listed patent applications are incorporated herein by reference.

FIELD OF THE INVENTION

The present invention relates to a system for testing a radio frequency (RF) subsystem of a transmitter/receiver device such as a mobile communications transmitter/receiver. The present invention also relates to a system and method for generating an arbitrary analog waveform. The present invention also relates to a system and method for generating a set of clock signals.

BACKGROUND OF THE INVENTION

FIG. 1 schematically illustrates a communications device. The device 10 of FIG. 1 is a transceiver (i.e., a transmitter and a receiver) which forms part of a cellular phone, cordless phone or personal digital assistant (PDA). The device 10 of FIG. 1 may be viewed as comprising a baseband subsystem 12 and an RF (radio frequency) subsystem 14.

In the transmitting mode, the baseband subsystem 12 receives data from a source and codes the data in a sequence of in-phase (I) and a sequence of quadrature (Q) channel symbols. The I and Q channel symbols are then fed to the RF subsystem 14 which modulates these symbols onto one or more RF carrier signals for remote transmission.

In the receiving mode, the RF subsystem 14, receives one or more RF carrier signals and demodulates from the received RF carrier signals a sequence of I and Q symbols. The I and Q symbols are delivered to the baseband subsystem 12 which decodes these I and Q symbols to regenerate source data.

For a variety of reasons it may be desirable to provide the capability for testing the RF subsystem of a communications device without the baseband subsystem. For example, during the design of a mobile communication device, the baseband and RF subsystems may be designed separately. Under such circumstances, it may be desirable to test the RF subsystem before the baseband subsystem is available. Alternatively, even if the baseband subsystem is available, it may be desirable to test the RF subsystem separately so that faults in the RF subsystem can be more easily located and identified.

Accordingly, it is an object of the present invention to provide a system which simulates a baseband subsystem in a communications transceiver.

SUMMARY OF THE INVENTION

This and other objects are achieved by the present invention. According to one embodiment, a baseband simulation subsystem is provided for testing an RF subsystem of a communication device, such as a cellular telephone, cordless telephone, etc. Illustratively, the inventive baseband simulation subsystem is connected, via an interface card, such as a Personal computer interface card (PCIF), to a computer system, such as an IBM™ PC compatible computer system. The baseband simulation subsystem is also connected to the RF subsystem under test.

The baseband simulation subsystem receives discrete samples from a source, such as the PC via the PCIF. The baseband simulation subsystem stores the received samples in a memory. In a transmit mode, the baseband simulation subsystem retrieves these prestored samples and generates therefrom analog baseband signals using digital to analog conversion. The baseband signals simulate inputs to the RF subsystem under test. In response to these simulated analog baseband signals inputted into the RF subsystem under test, the RF subsystem under test outputs RF band signals. In a receive mode, the RF subsystem receives RF band signals and demodulates these signals to generate analog baseband signals which are supplied to the baseband simulation subsystem. The baseband simulation subsystem converts the received analog baseband signals to discrete samples. The discrete samples are stored in the memory of the baseband simulation subsystem and/or supplied to the PC for analysis.

Illustratively, the baseband simulation subsystem includes three ports: a timing and control (TAC) port, an IQ port, and general purpose input output (GPIO) port. The TAC port includes a TAC FPGA (Field Programmable Gate Array) and a TAC memory. The TAC port receives a master clock signal from an external source and generates plural timing and control signals (i.e., plural clocks) therefrom.

The TAC port also includes at least one counter which is connected to an address input of the TAC memory. The counter and memory of the TAC port cooperate to generate the plural clocks. The plural clocks are synchronized to the master clock. The TAC counter cycles through its count state. For each count cycle, the TAC counter retrieves from the TAC memory, plural prestored signal levels, including one signal level for each clock to be generated. The TAC port outputs the retrieved signal levels, in parallel. These plural signal levels form the plural generated clocks.

The IQ port includes an IQ FPGA and an IQ memory. The IQ port receives at least one of these plural clocks. In the transmit mode, in response to one or more of the clocks generated by the TAC port, the IQ port retrieves from its IQ memory prestored discrete I and Q samples. Illustratively, a counter responsive to a clock signal generated by the TAC port counts through a sequence of states. Each state forms an address in the IQ memory used to retrieve one sample. The retrieved discrete I and Q samples represent a simulated message to be transmitted by the RF subsystem under test. The IQ port illustratively also includes digital to analog converters (DACs) which reconstructs transmit analog i and q signals from the retrieved discrete I and Q samples. The transmit analog i and q signals are then outputted from the IQ port to the RF subsystem.

In the receive mode, the IQ port receives analog i and q signals from the RF subsystem. The IQ port illustratively also includes analog to digital converters (ADCs) which, in response to one or more clocks generated by the TAC port, sample the received analog i and q signals and convert them to receive discrete I and Q samples. These receive discrete I and Q samples may be stored in the IQ memory. Alternatively, the receive discrete I and Q samples may be transferred from the IQ memory to the PC via the PCIF for analyzing the ability of the RF subsystem under test to demodulate the RF carrier signals to output the receive analog i and q signals.

The GPIO port includes a GPIO FPGA. The GPIO port exchanges auxiliary discrete data with the PC. The GPIO port also exchanges auxiliary digital and analog signals with the RF subsystem under test. In addition, the GPIO port includes DACs. The GPIO DACs convert particular auxiliary digital data to auxiliary analog signals. The auxiliary analog signals are, for example, control signals for various circuits in the RF subsystem, such as a power amplifier, an automatic gain control, and an automatic frequency control.

DETAILED DESCRIPTION OF PREFERRED EMBODIMENTS

Figure 2:
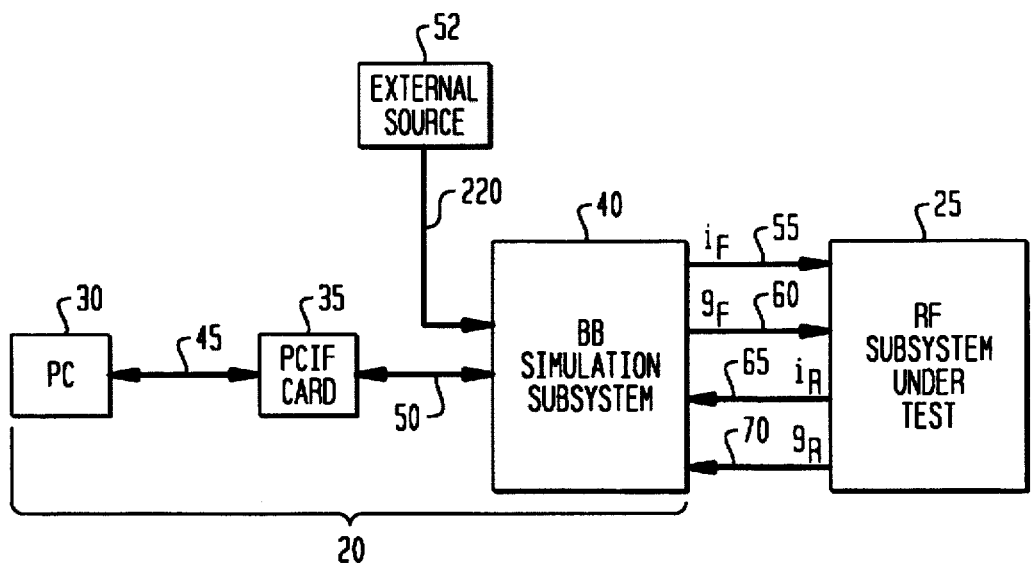
FIG. 2 depicts the interconnection of a baseband simulation subsystem according to an embodiment of the present invention to an RF subsystem under test.

FIG. 2 is an illustrative embodiment of a simulation system 20 according to the present invention. The simulation system 20 is used for testing an RF subsystem 25 of a communication device, such as a cellular telephone, cordless telephone, etc. The simulation system 20 comprises a computer system or PC (personal computer) 30, a PCIF (PC interface) card 35 and a BB (baseband) simulation subsystem 40. The BB simulation subsystem 40 is connected to the RF subsystem under test 25. The BB simulation subsystem 40, in conjunction with the PC 30 and the PCIF 35, tests the RF subsystem 25.

The computer system or PC 30, may be an IBM™ PC compatible computer system. The PC 30 is connected to the PCIF card 35. The PC 30 provides data and command signals on a PC bus 45 that control operation of the BB simulation subsystem 40. In addition, the PC 30 illustratively analyzes data received from the BB simulation subsystem 40. More than one computer system or PC may be connected to the PC bus 45 to perform these functions.

The PCIF card 35 is connected to the BB simulation subsystem 40 via an interface bus 50. The PCIF card 35 interfaces between the PC 30 and the BB simulation subsystem 40. The PCIF card 35 is designed to route and convert data and control signals to compatible formats between the PC 30 and the BB simulation subsystem 40. Thus, the PCIF card 35 allows data and control signals to be exchanged between the PC 30 and the BB simulation subsystem 40. Illustratively, digital data and control signals are exchanged between the PCIF card 35 and the BB simulation subsystem 40 via the interface bus 50. The BB simulation subsystem 40 also receives a master clock 220 from an external source 52.

In a transmit mode, the BB simulation subsystem 40 provides analog baseband transmit filtered signals $i_F$ (in-phase) and $q_F$ (quadrature) 55, 60 to the RF subsystem under test 25. The analog transmit filtered signals $i_F$ and $q_F$ 55, 60 are generated from sequences of discrete I and Q samples stored in a memory of the BB simulation subsystem 40. The prestored sequences of discrete I and Q samples represent simulated messages for transmission by the RF subsystem under test 25. The prestored sequences of discrete I and Q samples, rather than representing compressed versions of analog simulated messages, represent full resolutions of the analog messages for transmission by the RF subsystem under test 25. The BB simulation subsystem 40 retrieves the prestored discrete I and Q samples from its memory and converts them to analog transmit filtered signals $i_F$ and $q_F$ 55, 60. The RF subsystem under test 25 modulates the analog transmit filtered signals $i_F$ and $q_F$ 55, 60 onto one or more RF carrier signals.

In a receive mode of the baseband simulation system 20, the RF subsystem under test 25 demodulates one or more RF signals which carry baseband analog signals $i_R$ and $q_R$ 65, 70 modulated on RF carriers. The demodulation of the RF signals produces the baseband analog signals $i_R$ and $q_R$ 65, 70 which are supplied to the BB simulation subsystem 40. The BB simulation subsystem 40 converts the baseband analog receive signals $i_R$ and $q_R$ 65, 70 to sequences of receive discrete samples. The sequences of received discrete samples are provided to the PC 30 (via the interface bus 50, the PCIF card 35, and the PC bus 45) for analysis. The sequences of received discrete samples may also be stored in the memory of the BB simulation subsystem 40. The PC 30 analyzes this digital data to debug and validate the RF subsystem under test 25.

Figure 3:
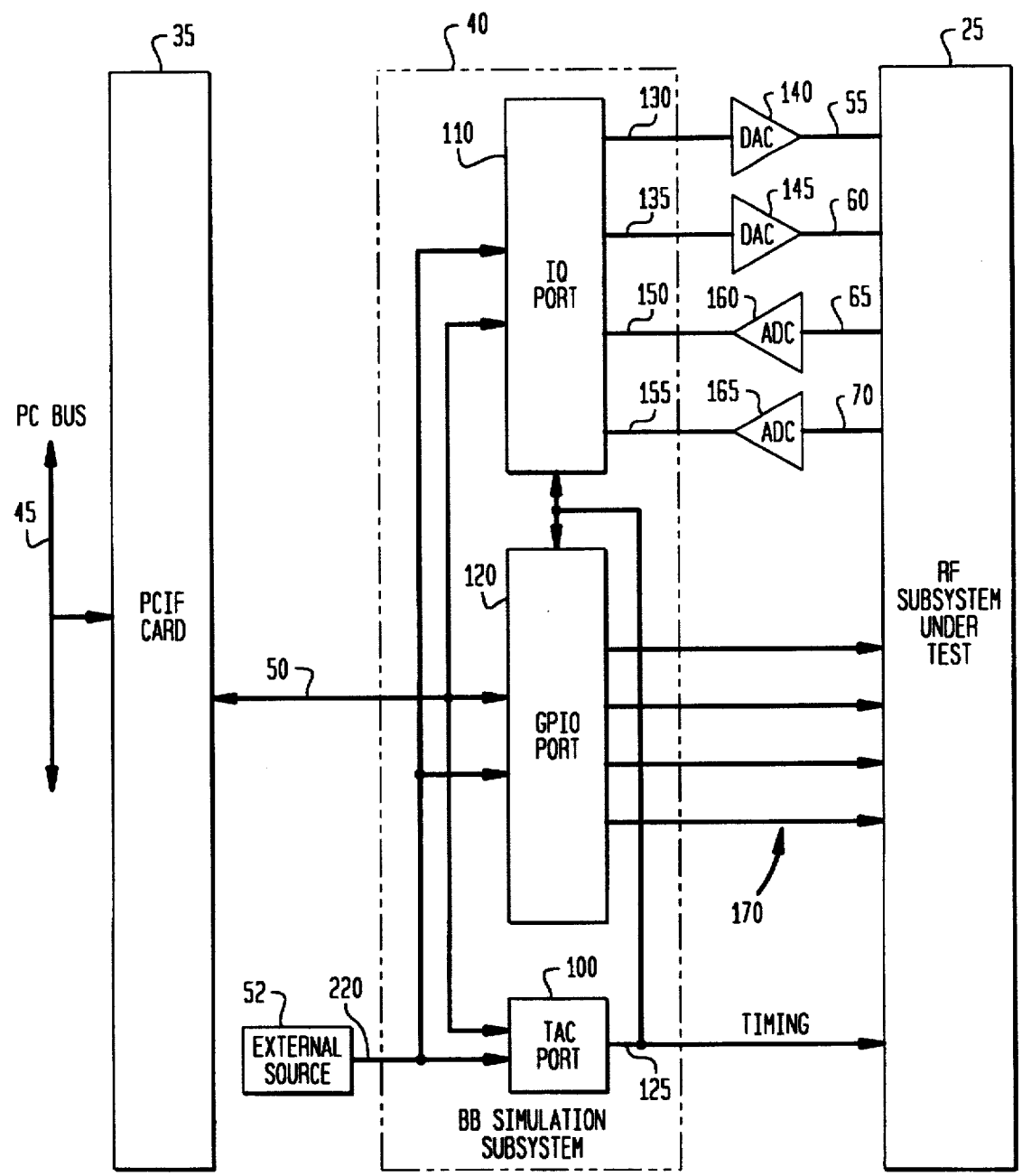
FIG. 3 depicts the architecture of the baseband simulation subsystem of FIG. 2.

FIG. 3 shows the BB simulation subsystem 40 in greater detail. The BB simulation subsystem 40 includes a timing and control (TAC) port 100, an IQ port 110 and, a GPIO port 120, where GPIO is General Purpose Input/Output. These three ports, (the TAC, IQ and GPIO ports 100, 110, 120) receive digital data and control signals via the interface bus 50 from the PCIF card 35. In addition, these three ports also receive the master clock 220 from the external source 52. Illustratively, the master clock 220 is a 13 MHz clock signal.

In response to the master clock, the TAC port 100 generates all of the timing signals for the RF subsystem under test 25, and for the BB simulation subsystem 40, i.e., for the IQ port 110, and for the GPIO port 120. The timing signals, also referred to as plural clocks, are provided on a timing signal line 125. Illustratively, the TAC port 100 generates 16 fully programmable timing signals; 8 for transmit functions and 8 for receive functions.

In the transmit mode, in response to one or more of the timing signals present on the timing signal line 125, the IQ port 110 retrieves sequences of prestored discrete I and Q samples 130, 135 from its memory. The retrieved sequences of discrete I and Q samples 130, 135 represent, illustratively, full resolution versions of an analog simulated message to be transmitted by the RF subsystem under test 25. The retrieved sequences of discrete I and Q samples 130, 135 are outputted from the IQ port 110 to digital to analog converters (DACs) 140, 145, respectively. The DACs 140, 145 convert the discrete I (in-phase) and Q (quadrature) samples 130, 135 to the analog transmit filtered signals $i_F$ and $q_F$ 55, 60 (also shown in FIG. 2). The analog transmit filtered signals $i_F$ and $q_F$ 55, 60 are then outputted to the RF subsystem under test 25.

In the receive mode, the IQ port 110 receives the baseband analog receive signals $i_R$ and $q_R$ 65, 70 (also shown in FIG. 2) from the RF subsystem under test 25. The received baseband analog receive signals $i_R$ and $q_R$ 65, 70 are converted from analog form to a sequence of digital or discrete samples 150, 155 by analog to digital converters (ADCs) 160, 165, respectively. The discrete samples are then stored in a memory forming part of the IQ port. Alternatively, the discrete samples are transmitted from the IQ memory to the PC 30 via the PCIF 35.

The GPIO port 120, in addition to receiving the digital data and control signals via the interface bus 50 from the PCIF card 35, also supports the transmission of auxiliary digital and baseband analog signals 170 to the RF subsystem under test 25. DACs (not shown) may be connected between the GPIO port 120 and the RF subsystem under test 25. These DACs convert digital signals to auxiliary signals 170 for transmission to the RF subsystem 25. Illustratively, the auxiliary signals 170 are control signals for various circuits in the RF subsystem under test 25, such as a power amplifier, an automatic gain control, and an automatic frequency control. The GPIO port 120 may also contain additional elements, such as monitor ports and interfaces for synthesizers.

The TAC port 100 generates plural clocks which are synchronized to the master clock that is supplied by the external source 52. The plural clocks are generated in cooperation with counters and a memory which has pre-stored discrete signal levels as explained below.

Illustratively, the TAC, IQ and GPIO ports 100, 110, 120 are each implemented using a Field Programmable Gate Array (FPGA) made by Xilinx™, model XC3195. In addition, each FPGA of the TAC and IQ ports 100, 110 has the following peripheral components: 3 Mbits of external SRAM (Static Random Access Memory), 128 kbits SPROM (Static Programmable Read Only Memory), and a PC interface port.

Figure 4:
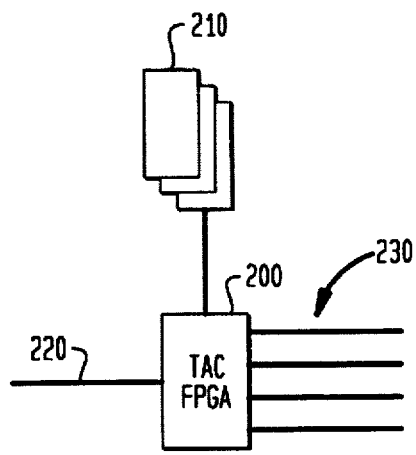
FIG. 4 depicts a block diagram of the timing and control port of FIG. 3.

FIG. 4 shows a block diagram of the TAC port 100. The TAC port 100 comprises a TAC FPGA 200 connected to a TAC memory 210. Illustratively, the RAM 210 is configured from three 256 k×4 bit SRAMs. This effectively forms a 256 k×12 bit SRAM. The TAC FPGA 200 receives the master clock 220 supplied by the external source 52 (FIG. 3). In response to the master clock 220, the TAC FPGA 200 retrieves discrete data prestores in the TAC memory 210 and generates plural clocks 230. The TAC FPGA 200 provides one or more of the plural clocks 230 to the IQ port 110, the GPIO port 120, and the RF subsystem under test 25 on the timing signal line 125 (FIG. 3).

Figure 5:
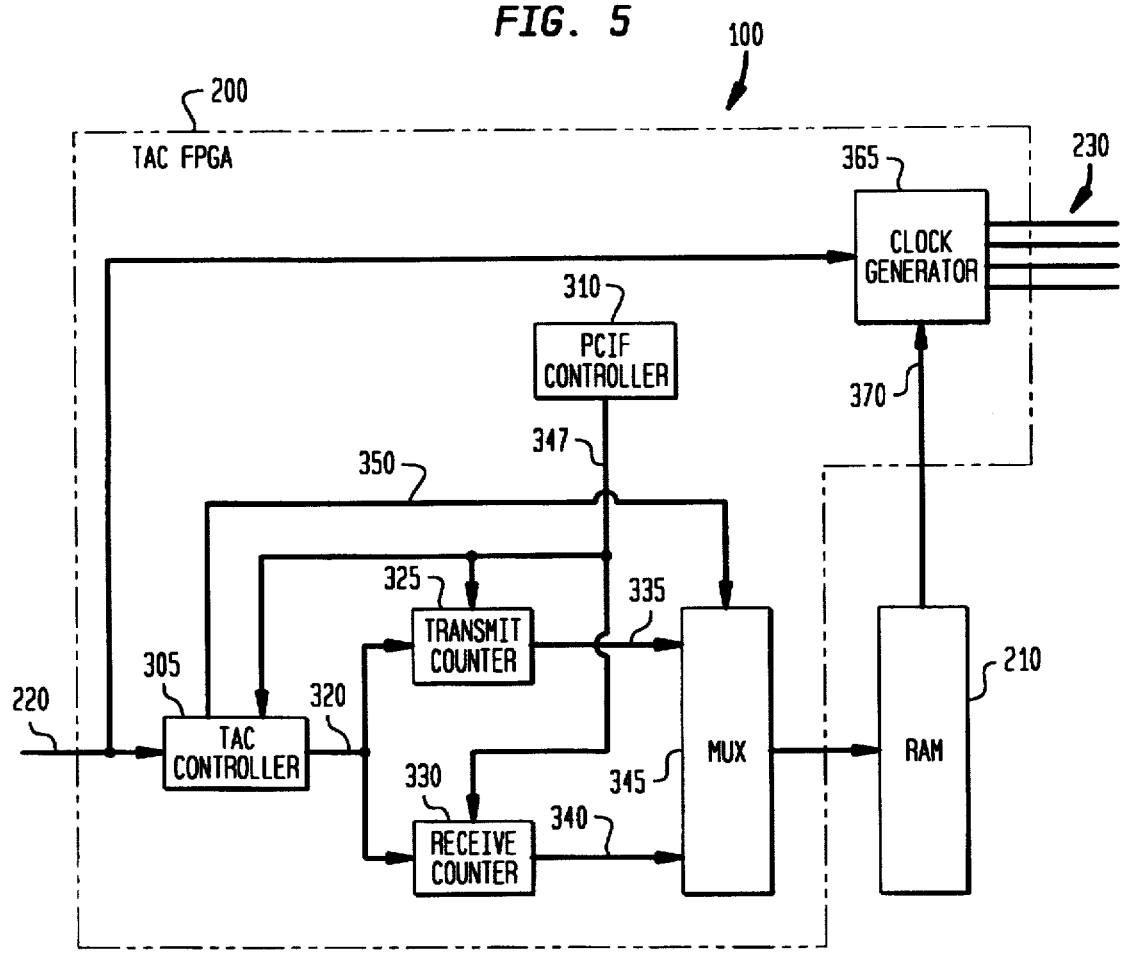
FIG. 5 depicts the timing and control port of FIG. 4 in greater detail.

FIG. 5 shows the TAC FPGA 200 in greater detail. The TAC FPGA 200 comprises TAC controller 305, a PCIF (Personal Computer Interface) controller 310, a transmit counter 325, a receive counter 330, a MUX (multiplexer) 345, and a clock generator 365. Illustratively, the TAC controller 305 and a PCIF controller 310 are autonomous finite state machines. The TAC controller 305 receives the master clock 220. The TAC controller 305 generates timing control signals 320. Illustratively, the TAC controller 305 provides the timing control signals 320 to the transmit counter 325 and the receive counter 330. Illustratively, the transmit and receive counters 325, 330 are 18-bit counters. In response to the timing control signals 320, the transmit and receive counters 325, 330 generate address signals 335, 340 for the timing operations during the transmit and receive modes of the TAC port 100. The address signals 335, 340 may also be used during a non-timing mode, when the PC 30 (FIG. 2) is reading/writing from/to the TAC memory 210.

The address outputs 335, 340 of the transmit and receive counters 325, 330 are provided to the MUX 345. The PCIF controller 310 provides a control signal 347 which enables/disables the operation of the TAC controller 305. The control signal 347 is also provided to the transmit and receive counters 325, 330. In response to the control signal 347, the TAC controller 305 generates a select signal 350 which is provided to the MUX 345. In response to the select signal 350, the MUX 345 outputs one of the address signals 335, 340 to the TAC memory 210 of the TAC port 100. This causes either the transmit counter 325 or the receive counter 330 to access the TAC memory 210. The reason for having two counters 325, 330 is such that the timing signals for the receive operation of the RF subsystem under test 25 can be easily offset against the timing signals for the transmit operation, without having to re-download the TAC memory 210.

Output and input latches (not shown) comprising an array of D-flip flops, for example, may also be used. Illustratively, an input latch may be located between input signals and the PCIF controller 310. In addition, an output latch may be located between output signals and the TAC controller 305. The output latch may be used to remove glitches from outputted signals and the input latch may be used to synchronize all input signals to the master clock 220. The TAC port 100 may also include registers and circuitry to allow the PCIF port card 35 (FIG. 2) to read and write data to and from the TAC RAM 210. Illustratively, the TAC port 100 has eight 8-bit registers.

The TAC port 100 generates the plural clocks 230 from the master clock 220 and provides the IQ and GPIO ports 110, 120 with one or more of the generated plural clocks 230 on the timing signal line 125 (FIG. 3). In addition, other functions of the TAC port 100 include interfacing to the PCIF card 35, allowing the PC 30 (FIG. 2) to read/write data from/to TAC RAM 210 in non-timing mode, and reading data from the TAC RAM 210.

The plural clocks 230 are generated from a clock generator 365 in response to the master clock 220 and data 370 retrieved from the TAC RAM 210. The clock generator 365 also performs a deglitching function, wherein glitches, such as noise spikes, are removed from the clock signals. In one illustrative embodiment, each signal level or bit of a data word prestored in the TAC RAM 210 is used to generate one cycle of one of the plural clocks 230. That is, the plural clocks 230 are the parallel output of the signal levels or bits retrieved from the TAC RAM 210. For example, if a four bit data word is prestored in the TAC RAM 210, then four clocks 230 are generated by the clock generator 365. For a four bit data word $b_4 b_3 b_2 b_1$ the first bit $b_1$ of the prestored data word $b_4 b_3 b_2 b_1$ corresponds to the first cycle of the first clock; the second bit $b_2$ corresponds to the first cycle of the second clock; the third bit $b_3$ corresponds to the first cycle of the third clock; and the fourth bit $b_4$ corresponds to the first cycle of the fourth clock.

Figure 6:
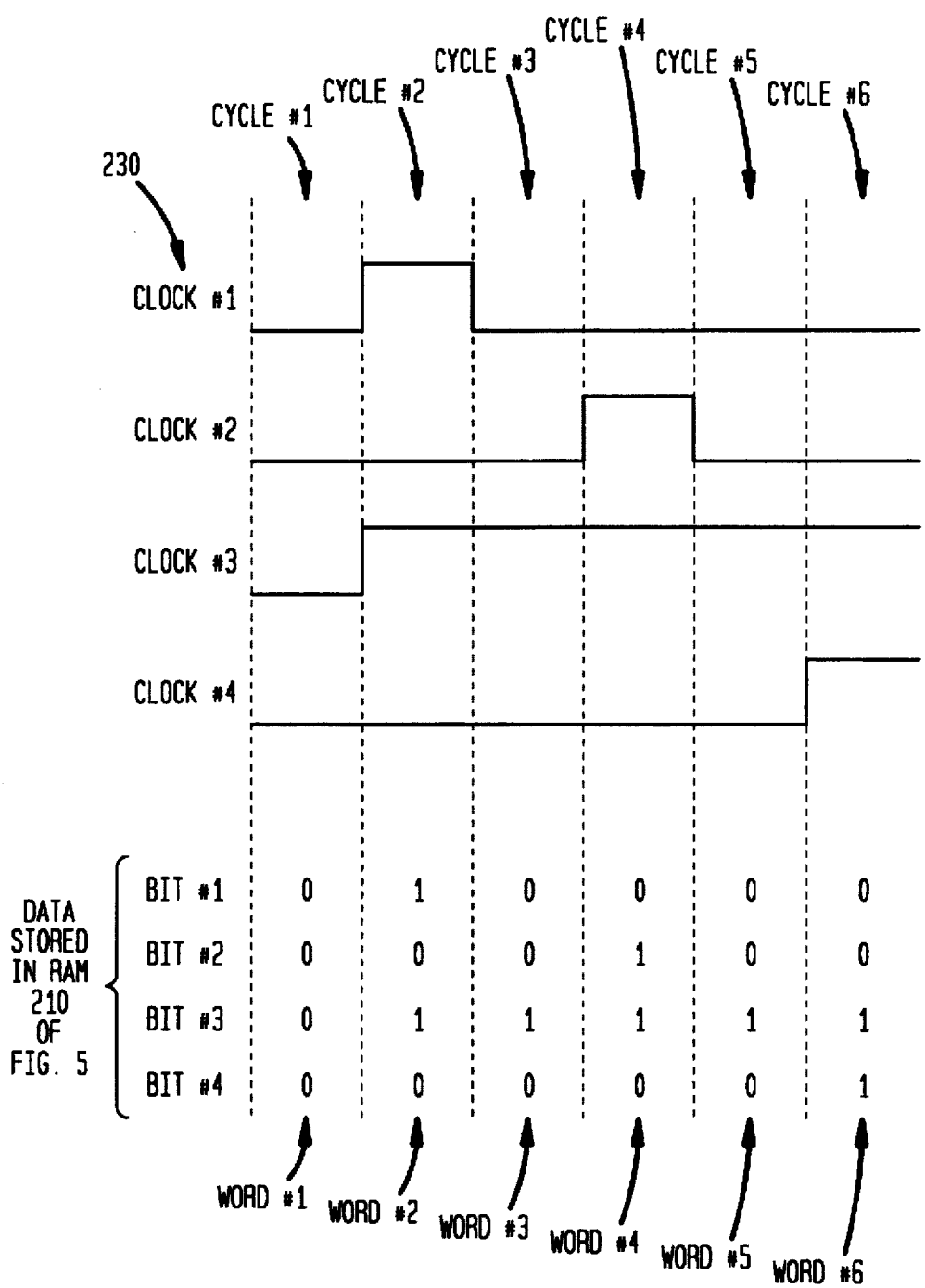
FIG. 6 depicts plural clocks generated by the TAC port according to the present invention.

As an illustrative example, FIG. 6 shows four clocks 230 generated from four bit data words stored in the TAC RAM 21 0. For a prestored four bit first data word being 0000, the values of the first cycle #1 of the four clocks 1, 2, 3, 4, are low. For a prestored four bit second data word of 0101, where the first bit is the least significant bit, which is '1' in this case, then the values of the second cycle #2 of clocks 1, 3 are high and that of clocks 2, 4 are low. Similarly, for a prestored four bit third data word of 0100, then the values of the third cycle #3 of clocks 1, 2, 4 are low and the value of the third cycle #3 of clock 3 is high. In this fashion, the plural clocks 230 are outputted in parallel, wherein one cycle of all the plural clocks 230 corresponds to one data word prestored in the TAC RAM 210.

After the desired data words are retrieved and the plural clocks 230 generated, the process is repeated. Thus, the plural clocks 230 repeat after a desired number of cycles. In the illustrative example shown in FIG. 6, the plural clocks 230 repeat after 6 cycles.

Figure 7:
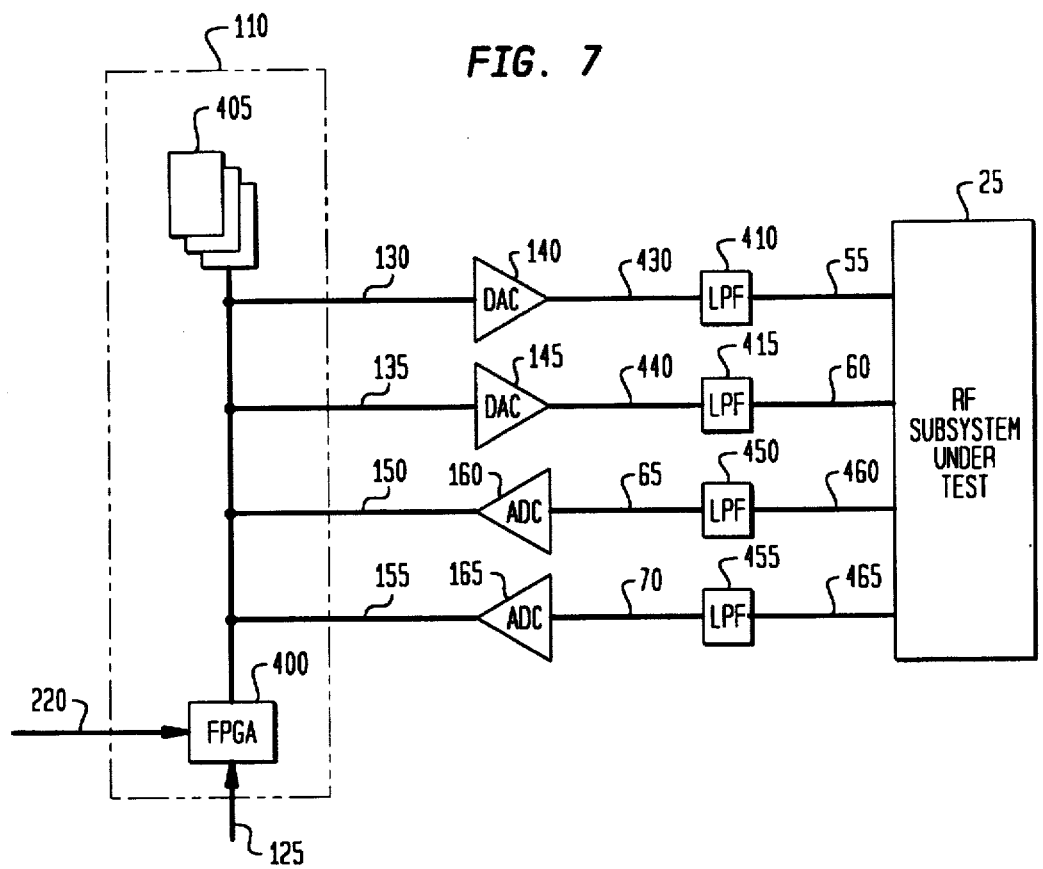
FIG. 7 depicts a block diagram of the IQ port of FIG. 3.

At least one of these plural clocks 230 is provided to the IQ port 110 through the timing signal line 125. FIG. 7 shows the IQ port 110 in greater detail. The IQ port 110 comprises an IQ FPGA 400 and an IQ memory 405. In addition, the two DACs 140, 145 and the two ADCs 160, 165 (also shown in FIG. 3) provide an interface between the RF subsystem under test 25 and the BB simulation subsystem 40 (FIG. 3) containing the IQ port 110.

Illustratively, the IQ memory 405 is configured from three 256 k×4 bit RAMs to effectively form a 256 k×12 bit RAM. The IQ port 110 is configured to generate and/or receive analog data on the I and Q channels.

The DACs 140, 145 may be 10 bit DACs used to transmit I and Q data, respectively, to the RF subsystem under test 25. The ADCs 160, 165 may be 10 bit ADCs which receive I and Q data, respectively, from the RF subsystem under test 25. Illustratively, the DACs 140, 145 and ADCs 160, 165 support 10-bit resolution with conversion time of less than 450 ns over a voltage range of 5 volts. LPFs (Low Pass Filters) 410, 415 are connected between the DACs 140, 145 and the RF subsystem under test 25. In addition, LPFs 450, 455 are connected between the ADCs 160, 165 and the RF subsystem under test 25. Each LPF 410, 415, 450, 455 may be a 2-pole linear phase low pass filter with a cut-off frequency of 200 KHz.

The IQ FPGA 400 receives timing signals on the timing signal line 125 and the master clock 220. The timing signals on the timing signal line 125 may be one or more of the plural clocks 230 (FIGS. 5, 6) generated by the TAC port 100.

In the transmit mode, in response to one or more of the clocks 230 (received on the timing signal line 125) generated by the TAC port 100, the IQ port 110, retrieves the prestored discrete I and Q samples from its IQ RAM 405. Illustratively, a counter of the IQ FPGA 400, responsive to one or more of the plural clocks 230, counts through a sequence of states. Each state forms an address in the IQ memory 405 used to retrieve one sample. The prestored discrete I and Q samples retrieved from the IQ memory 405, rather than representing compressed versions of analog signals, represent full resolution versions of the analog signals for transmission by the RF subsystem under test 25. Illustratively, the prestored discrete I and Q samples correspond to analog waveforms such as gaussian waveforms, raised cosine or sine waveforms, etc.

In conjunction with the DACs 140, 145, the IQ port 110 converts each retrieved discrete I and Q samples to the analog transmit signals $i_T$ and $q_T$ 430, 440. Illustratively, latches (not shown) receive the discrete I and Q samples retrieved from the IQ memory 405 in sequence. These latches output the retrieved discrete I and Q samples simultaneously to the DACs 140, 145. The DACs 140, 145 reconstructs the analog transmit signals $i_T$ and $q_T$ 430, 440 from the retrieved samples which are the full resolution representation of analog signals.

The analog transmit signals $i_T$ and $q_T$ 430, 440 are outputted from the DACs 140, 145, to the LPFs 410, 415 for filtering. The LPFs 410, 415 output the analog transmit filtered signals $i_F$ and $q_F$ 55, 60 (see also FIGS. 2 and 3). The analog transmit filtered signals $i_F$ and $q_F$ 55, 60 are then outputted to the RF subsystem under test 25. The low pass filters 410, 415, which filter the analog transmit signals $i_T$ and $q_T$ 430, 440, filter out noise and high frequencies from the analog transmit signals $i_T$ and $q_T$ 430, 440. This smoothens the analog transmit signals $i_T$ and $q_T$ 430, 440 and provides the analog transmit filtered signals $i_F$ and $q_F$ 55, 60.

In the receive mode, the LPFs 450, 455 of the IQ port 110 receive baseband analog receive signals 460, 465, respectively, from the RF subsystem under test 25. The LPFs 450, 455 output filtered baseband analog receive signals $i_R$ and $q_R$ 65, 70 (also shown in FIGS. 2 and 3), respectively. The low pass filters 450, 455 filter out noise and high frequencies from the analog receive signals 460, 465, respectively. This smoothens the analog receive signals 460, 465, and provides the filtered receive baseband analog signals $i_R$ and $q_R$ 65, 70. The ADCs 160, 165 of the IQ port 110 receive the baseband analog receive signals $i_R$ and $q_R$ 65, 70, respectively, from the LPFs 450, 455.

In response to one or more of the clocks 230 (received on the timing signal line 125 and) generated by the TAC port 100, the ADCs 160, 165 of the IQ port 110 convert the received baseband analog signals $i_R$ and $q_R$ 65, 70 to the sequence of discrete I symbols 150 and the sequence of discrete Q symbols 155, respectively (also shown in FIG. 3). The sequences of discrete I and Q symbols 150, 155 may be stored in the IQ memory 405. Alternatively, these sequences of discrete I and Q symbols 150, 155 may illustratively be transferred to the PC 30 (FIG. 2) from the IQ memory 405 via the PCIF card 35 for analyzing the ability of the RF subsystem under test 25 to receive one or more carrier signals and to demodulate I and Q analog signals therefrom.

Figure 8:
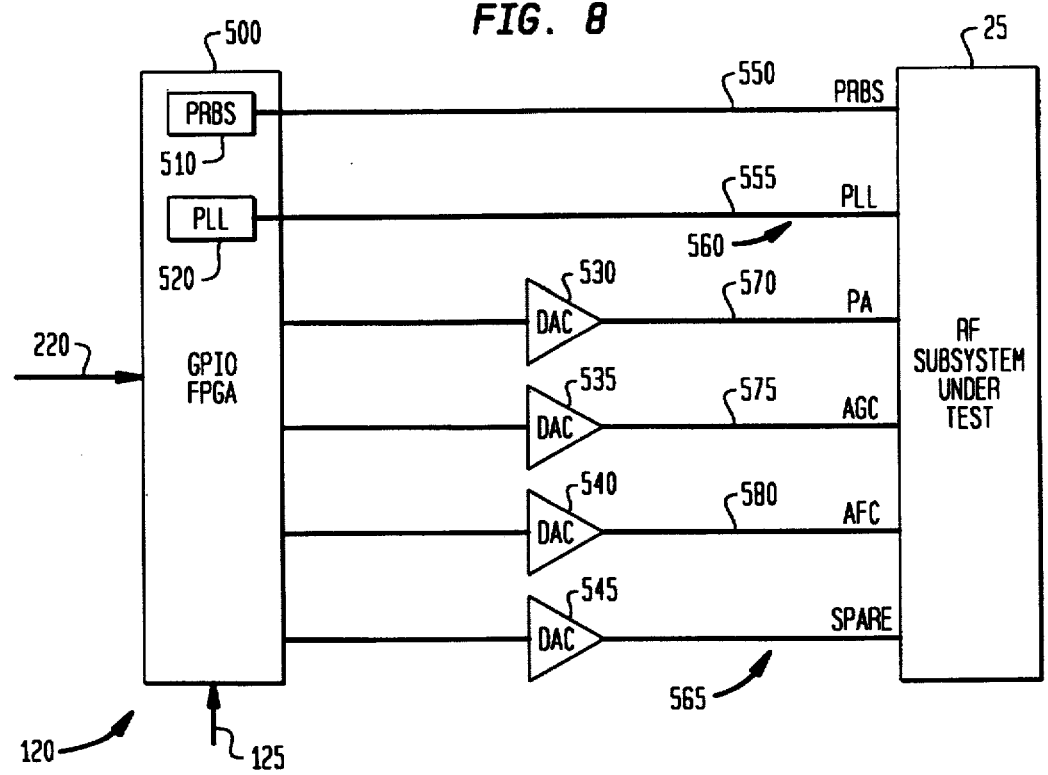
FIG. 8 depicts a block diagram of the GPIO port of FIG. 3.

FIG. 8 shows a block diagram of the GPIO port 120. The GPIO port 120 comprises a GPIO FPGA 500 which has a pseudo-random bit sequence (PRBS) generator 510, and a Phase Lock Loop (PLL) register 520. The GPIO port 120 also comprises a plurality of DACs. Illustratively, four DACs 530, 535, 540 and 545 are provided. The GPIO FPGA 500 receives the master clock 220 supplied by the external source 52 (FIG. 3). In response to one or more of the plural clocks 230 (shown in FIG. 5 and generated by the TAC port 100), received on the timing signal line 125, and the master clock 220, the GPIO FPGA 500 provides digital signals to the DACs 530, 535, 540, 545. The master clock 220 and one or more of the plural clocks 230 also cause the PRBS generator 510 and the PLL register 520 of the GPIO FPGA 500 to output a PRBS signal 550 and a PLL signal 555, respectively. Illustratively, the PRBS signal 550 is random bit streams, and the PLL register 520 is a 21 bit register which provides a 21 bit serial PLL signal 555 used in a phase lock loop circuit of the RF subsystem under test 25. The PRBS signal 550 and PLL signal 555 are auxiliary digital signals 560 provided to the RF subsystem under test 25.

The DACs 530, 535, 540, 545 provide auxiliary baseband analog signals 565. The auxiliary baseband analog signals 565 and the auxiliary digital signals 560 form the auxiliary signals 170 shown in FIG. 3. Illustratively, the DAC 530 provides a power amplifier (PA) signal 570 which controls the amplitude and slope of a pulse used as a control signal for a power amplifier of the RF subsystem under test 25. The DAC 535 provides an AGC signal 575 used in an automatic gain control circuit of the RF subsystem under test 25. The DAC 540 provides an AFC signal 580 used in an automatic frequency control circuit of the RF subsystem under test 25. The DAC 540 is a spare to be used for providing additional signals as needed.

The GPIO port 120 may also contain additional elements, such as monitor ports and interfaces for synthesizers. For example, the GPIO port 120 may have an 8-bit monitor port which latches digital status signals outputted from the RF subsystem under test 25. The monitor port is synchronized to the master clock so that its status may be reported at a desired basis.

Figure 9:
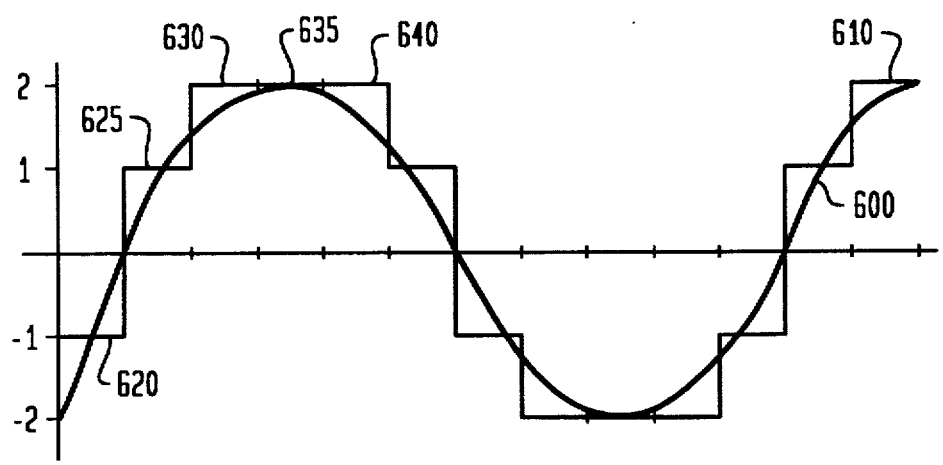
FIG. 9 depicts illustrative digital and analog I or Q waveforms.

FIG. 9 shows an i or q analog signal 600 which represents the received baseband analog receive signals $i_R$ or $q_R$ 65, 70 of FIGS. 3 and 7. In the receive mode, the ADCs 160, 165 sample the analog signal 600 to form a sampled signal 610. The sampled signal 610 represents the sequences of discrete I or Q symbols 150, 155 of FIG. 7. Each sample is a digital value and is stored in a particular address of a memory (such as the IQ RAM 405 of FIG. 7). For example, the first sample 620 has a value of −1. This value may be represented by a 3 bit digital word, wherein the most significant bit is a sign bit wherein a '1' indicates a negative number. Using this illustrative example, the value −1 of the first sample 620 is represented by 101 and is stored address 0 of the IQ RAM 405 (FIG. 7). Alternatively, instead of using bits to represent signs and magnitudes, two's compliment notation may by used.

Figure 1:
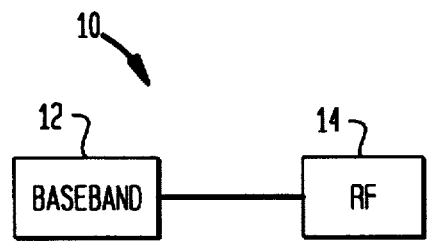
FIG. 1 depicts a conventional communications system.

The second sample 625 has a value of 1, represented by the digital word 001 which is stored in address 1 of the IQ RAM 405. The third, fourth and fifth samples 630, 635, 640, have a value of 2, represented by the digital word 010 which are stored in addresses 2, 3 and 4. In a similar fashion, digital words or symbols representing the value of the sampled signal 610 are stored in particular address locations of the IQ RAM 405. The stored data, rather than representing compressed versions of the received baseband analog receive signals $i_R$ or $q_R$ 65, 70, represent full resolution versions of the received baseband analog receive signals $i_R$ or $q_R$ 65, 70. The stored data is routed to the PC 30 through the PCIF card 35 for analysis to determine the proper operation of the RF subsystem under test 25 (see FIG. 1).

The reverse operation occurs in the transmit mode, where the IQ port 110 supplies the RF subsystem under test 25 with the analog transmit filtered signals $i_F$ and $q_F$ 55, 60 shown in FIGS. 2, 3, and 7. The prestored discrete I and Q samples 130, 135 stored in the IQ RAM 405 contain full resolution versions (rather than compressed versions) of digital samples of arbitrary baseband analog signals, such as the analog signal 600 shown in FIG. 9. There is an analog waveform that corresponds to a particular set of samples. These analog waveforms can vary from one communication system to another. For instance, the analog waveforms can be gaussian waveforms, raised cosine waveforms, etc. The PC 30 (FIG. 1) computes the sequences of discrete I and Q samples 130, 135, representing these analog waveforms, and stores them in the IQ RAM 405. The samples of each waveform are illustratively stored in consecutive addresses so that they can be easily retrieved by the IQ FPGA 400, shown in FIG. 7, on a sample by sample basis.

The analog transmit filtered signals $i_F$ and $q_F$ 55, 60 (shown in FIGS. 2, 3, and 7) are generated from the full resolution discrete sequence of samples prestored in the IQ RAM 405. Each prestored sample is represented by a digital word. For example, the digital word 101 represents a pulse having a value of −1. Thus, retrieving the digital word 101 from address 0 of the IQ RAM 405 produces a pulse having a value of −1. Similarly, a digital word 001 retrieved from address 1 of the IQ RAM 405 causes generation of a pulse having an amplitude of 1. Retrieving the prestored digital samples reconstructs the digitized or sampled signal 610. Thereafter, the DACs 140; 145 (shown in FIGS. 3 and 7) convert the sampled signal 610 to the analog signal 600.

This invention has many advantages. The inventive baseband simulation subsystem allows testing an RF subsystem without the need for its complementary baseband subsystem. This allows developing the RF subsystem independent from its complementary baseband subsystem. Thus, the development of the RF subsystem is not hindered by the unavailability of its complementary baseband subsystem.

In addition, the inventive baseband simulation subsystem extensively tests the RF subsystem under normal operating conditions, and allows troubleshooting and debugging rather than limited pass fail testing. This allows refinement of the RF subsystem which may result in refinement of the baseband subsystem design. Refining the design of a baseband subsystem is more cost effective than refining an already realized and constructed baseband subsystem.

Furthermore, the invention allows validation of an RF subsystem which in turn can be used to validate a baseband subsystem. Having a validated RF subsystem, which is tested to function properly by the inventive baseband simulation subsystem reduces validation time for an actual baseband subsystem under test, since any faults can be attributed to the baseband subsystem under test rather than to the RF subsystem. Thus, the task of debugging and prototyping are made easier and less costly.

The above described embodiments of the invention are intended to be illustrative only. Numerous alternative embodiments may be devised by those skilled in the art without departing from the spirit and scope of the following claims.

The claimed invention is:

1. A process for generating and receiving arbitrary analog waveforms comprising the steps of:

generating a sequence of discrete samples by a computer, said sequence of discrete samples representing a full resolution uncompressed version of a first arbitrary analog waveform, wherein said first arbitrary analog waveform simulates an output of a baseband subsystem of a communication device;

storing said full resolution uncompressed discrete samples in a memory;

counting out addresses by a counter to retrieve said full resolution uncompressed discrete samples from said memory;

converting said retrieved full resolution uncompressed discrete samples to said first analog waveform by a digital to analog converter;

transmitting said first arbitrary waveform to an RF subsystem of said communication device for modulation on an RF carrier;

receiving a second arbitrary analog waveform from said RF subsystem; and storing said second arbitrary analog waveform in said memory.

2. The process of claim 1, wherein said sequence of discrete samples comprises a first sequence of discrete samples, wherein said step of storing said second arbitrary analog waveform further comprises the steps of:

converting said received second arbitrary analog waveform into a second sequence of discrete samples; and storing said second sequence of discrete samples in said memory.

3. The process of claim 2, wherein said step of converting said received second arbitrary analog waveform, further comprises the steps of:

converting said second arbitrary analog waveform into a filtered baseband analog receive signal; and converting said filtered analog baseband receive signal into said second sequence of discrete samples.

4. The process of claim 1, further comprising the steps of:
generating a random bit stream; and
transmitting said random bit stream to said RF subsystem.

5. The process of claim 1, further comprising the steps of:
generating a phase lock loop signal; and
transmitting said phase lock loop signal to said RF subsystem.

6. The process of claim 1, further comprising the steps of:
generating a power amplifier signal; and
transmitting said power amplifier signal to said RF subsystem.

7. The process of claim 1, further comprising the steps of:
generating an automatic gain control signal; and
transmitting said automatic gain control signal to said RF subsystem.

8. The process of claim 1, further comprising the steps of:
generating an automatic frequency control signal; and
transmitting said automatic frequency control signal to said RF subsystem.

9. The process of claim 1, further comprising the steps of:
generating a timing signal; and
transmitting said timing signal to said RF subsystem.

10. An apparatus for generating and receiving arbitrary analog waveforms comprising:

a memory for storing a first sequence of discrete samples, receiving a second sequence of discrete samples, and storing said second sequence of discrete samples, said sequences of discrete samples representing full resolution uncompressed analog waveforms, wherein said first sequence of discrete samples simulates an output of a baseband subsystem of a communication device;

a first circuit configured to receive said first sequence of discrete samples, convert said first sequence of discrete samples to a first analog waveform and transmit said first analog waveform to an RF subsystem; and a second circuit configured to receive a second analog waveform from said RF subsystem and convert said second analog waveform to said second sequence of discrete samples for transmission to said memory.

11. The apparatus of claim 10, further comprising:
a counter for counting out addresses to retrieve said first sequence of discrete samples from said memory.

12. The apparatus of claim 10, wherein said first circuit further comprises:
a digital to analog converter; and
a low pass filter.

13. The apparatus of claim 10, wherein said second circuit further comprises:
an analog to digital converter; and
a low pass filter.

* * * * *